US009995772B2

(12) United States Patent
Kotake et al.

(10) Patent No.: US 9,995,772 B2
(45) Date of Patent: Jun. 12, 2018

(54) CURRENT MEASUREMENT DEVICE AND CURRENT CALCULATION METHOD

(71) Applicant: Mitsubishi Electric Corporation, Tokyo (JP)

(72) Inventors: Hiroaki Kotake, Tokyo (JP); Yoshiaki Koizumi, Tokyo (JP); Masahiro Ishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 309 days.

(21) Appl. No.: 14/781,326

(22) PCT Filed: May 13, 2014

(86) PCT No.: PCT/JP2014/062715
§ 371 (c)(1),
(2) Date: Sep. 30, 2015

(87) PCT Pub. No.: WO2014/185409
PCT Pub. Date: Nov. 20, 2014

(65) Prior Publication Data
US 2016/0054359 A1 Feb. 25, 2016

(30) Foreign Application Priority Data
May 15, 2013 (JP) .................................. 2013-102889

(51) Int. Cl.
*G01R 15/18* (2006.01)
*G01R 19/00* (2006.01)
*H01F 38/28* (2006.01)

(52) U.S. Cl.
CPC ....... *G01R 15/181* (2013.01); *G01R 19/0092* (2013.01); *H01F 38/28* (2013.01)

(58) Field of Classification Search
CPC combination set(s) only.
See application file for complete search history.

(56) References Cited

U.S. PATENT DOCUMENTS 5,521,572 A 5/1996 Goodwin et al.
5,642,041 A 6/1997 Berkcan
(Continued)

FOREIGN PATENT DOCUMENTS

CN 201035065 Y 3/2008
EP 1 515 146 A1 3/2005
(Continued)

OTHER PUBLICATIONS

International Search Report of the International Searching Authority dated Aug. 5, 2014 for the corresponding international application No. PCT/JP2014/062715 (and English translation).
(Continued)

*Primary Examiner* — Vincent Q Nguyen
(74) *Attorney, Agent, or Firm* — Posz Law Group, PLC

(57) ABSTRACT

This current measurement device includes a conductor, a first terminal block, a pair of detection coils and a current calculator. A magnetic field, proportional to the magnitude of a conducted to-be-measured current, is generated around the conductor. The first terminal block has a placement surface on which the conductor is disposed. The pair of detection coils has the configuration, connected in series and in opposite polarities, and disposed on the placement surface of the first terminal block such that the conductor is between the pair of detection coils, and each coil is spaced from the conductor by an insulating distance. The detection coils output an inductive voltage signal produced by the magnetic field generated by the conductor and an external magnetic field which is magnetic noise. A current calculator calculates the value of the to-be-measured current on the basis of the inductive voltage signals from the pair of detection coils.

8 Claims, 12 Drawing Sheets

(56) References Cited

U.S. PATENT DOCUMENTS

| | | | |
|---|---|---|---|
| 6,094,043 A | 7/2000 | Scott et al. | |
| 6,177,806 B1 | 1/2001 | Burghartz | |
| 6,441,605 B1 | 8/2002 | Baurand et al. | |
| 2003/0214313 A1 | 11/2003 | Omura et al. | |
| 2006/0113987 A1* | 6/2006 | Sorensen | G01R 15/148 |
| | | | 324/117 H |
| 2011/0187348 A1 | 8/2011 | Soneda et al. | |
| 2013/0106412 A1 | 5/2013 | Momura et al. | |
| 2013/0141077 A1* | 6/2013 | Wellenstein | G01R 19/0092 |
| | | | 324/76.39 |

FOREIGN PATENT DOCUMENTS

| | | |
|---|---|---|
| EP | 2 355 265 A2 | 8/2011 |
| JP | H07-159449 A | 6/1995 |
| JP | 2000-147023 A | 5/2000 |
| JP | 2003-510612 A | 3/2003 |
| JP | 2008-170244 A | 7/2008 |
| JP | 2010-203927 A | 9/2010 |
| JP | 2011-220952 A | 11/2011 |
| KR | 100748511 B1 | 8/2007 |

OTHER PUBLICATIONS

Office Action dated Jul. 29, 2014 issued in corresponding JP patent application No. 2013-102889 (and English translation).
Office Action dated Mar. 17, 2015 issued in corresponding JP patent application No. 2013-102889 (and English translation).
Extended European Search Report dated Jan. 5, 2017 issued in corresponding EP patent application No. 14798426.4.
Office Action dated Mar. 31, 2017 issued in corresponding CN patent application No. 201480027339.9 (and English translation).

* cited by examiner

CURRENT MEASUREMENT DEVICE AND CURRENT CALCULATION METHOD

CROSS REFERENCE TO RELATED APPLICATION

This application is a U.S. national stage application of International Patent Application No. PCT/JP2014/062715 filed on May 13, 2014, which claims priority to Japanese Patent Application No. 2013-102889 filed on May 15, 2013, the contents of which are incorporated herein by reference.

TECHNICAL FIELD

The present disclosure relates to technology for measuring alternating current flowing in a conductor such as a conductive plate, an electric line and/or the like.

BACKGROUND

In recent years, current measurement devices have been used for non-contact measurement of alternating current flowing in electric lines of a distribution board and/or the like, in order to measure the consumed power of a plant, a household and/or the like.

A current measurement device of this type is disclosed in, for example, Patent Literature 1. The current measurement device of Patent Literature 1 comprises a conductor for generating a magnetic field in the surroundings through conducted alternating current, and two detection coils for outputting an inductive voltage signal in accordance with the magnetic field.

One of the two detection coils is disposed on a surface of the conductor via an insulating sheet. The other detection coil is disposed separately from the conductor so as not to receive the influence of the magnetic field generated from the conductor. In the one detection coil, an inductive voltage signal is generated in accordance with the change in the magnetic field that is the sum of the magnetic field generated from the conductor and an external magnetic field that is magnetic noise. In the other detection coil, an inductive voltage signal is generated in accordance with only the external magnetic field. The two detection coils are connected to each other in series and in opposite polarity. That is to say, the two detection coils are connected so that the changes in the inductive voltage signals generated by the external magnetic field are opposite. Consequently, the external magnetic field portions are offset, and an inductive voltage signal for the magnetic field portion from the conductor is output as a current detection signal. Then, the alternating current value of the conductor is calculated based on the current detection signal.

PATENT LITERATURE

Patent Literature 1: Unexamined Japanese Patent Application Kokai Publication No. 2011-220952

With the current measurement device disclosed in Patent Literature 1, one of the detection coils is disposed on the surface of the conductor via an insulating sheet, and the other detection coil is disposed separately from the conductor so as not to receive the influence of the magnetic field generated from the conductor. Consequently, the device configuration is complex. Furthermore, the influence of the external magnetic field on the two detection coils may differ, so that removal of the external magnetic field portion is not suitably done, thereby creating the problem that the current detection accuracy is low.

Moreover, Patent Literature 1 also discloses a configuration in which the detection coils are disposed on the front surface and back surface of the conductor via insulating sheets, and the two detection coils are connected to each other in series and in opposite polarity. Regarding this configuration, Patent Literature 1 also discloses a current measurement device with a configuration for outputting an inductive voltage signal in which the external magnetic field portions are offset and the magnetic field portions from the conductor are summed. With this configuration, when the conductor is in a state fixed to a terminal block, the detection coil on the front surface is exposed and the detection coil on the back surface is hidden between the conductor and the terminal block. Consequently, the influence of the external magnetic field on the two detection coils differs, and thus removal of the external magnetic field portion is not suitably done, resulting in the problem that current detection accuracy is low.

SUMMARY

In consideration of the foregoing, it is an objective of the present disclosure to provide a current measurement device and current calculation method capable of accomplishing highly accurate current measurements with a simple configuration.

In order to achieve the above-described objective, the current measurement device according to the present disclosure comprises:

a conductor in which a to-be-measured current flows;

a base including a placement surface on which the conductor is disposed;

a pair of detection coils having the same configuration, connected in series and in opposite polarity with respect to each other, and disposed on the placement surface of the base such that the conductor is positioned between the pair of detection coils, and each detection coil of the pair of detection coils is spaced from the conductor by an insulating distance; and a calculator configured to calculate a value of the to-be-measured current based on an inductive voltage signal from the pair of detection coils.

According to the present disclosure, a pair of detection coils is arranged on a placement surface of a base on which a conductor is disposed, such that each detection coil is spaced from the conductor by an insulating distance. Such arrangement does not require an insulating sheet, thereby simplifying the configuration. In addition, the coils are connected to each other in series and in opposite polarity, with the conductor therebetween. Thus, highly-accurate current measurement can be achieved.

DETAILED DESCRIPTION

A current measurement device according to embodiments of the present disclosure is described in detail below with reference to the drawings.

First Embodiment

Figure 1:
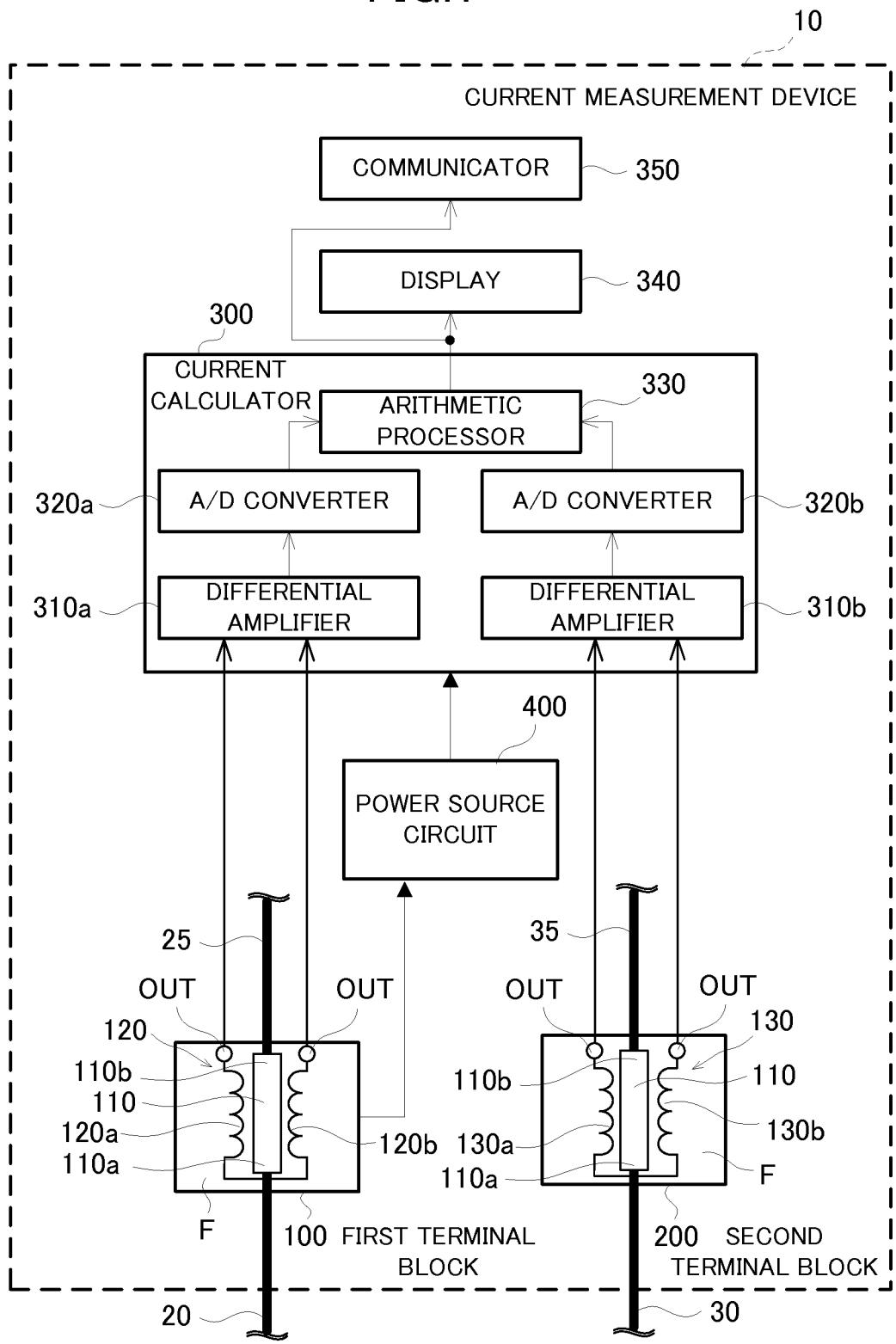
FIG. 1 is a configuration diagram of a current measurement device according to a first embodiment of the present disclosure.

A current measurement device 10 according to a first embodiment of the present disclosure is a device for measuring, without contact, alternating currents flowing in an L1-phase electric line 20 and an L2-phase electric line 30 of a single-phase three-wire system, as shown in FIG. 1. The current measurement device 10 comprises a first terminal block 100 to which the L1-phase electric line 20 is connected, a second terminal block 200 to which the L2-phase electric line 30 is connected, a current calculator 300 for calculating the values of the alternating currents flowing in the L1-phase electric line 20 and the L2-phase electric line 30, and a power source circuit 400 for generating power source voltage.

Furthermore, the current measurement device 10 comprises a display 340 for displaying the alternating-current values calculated by the current calculator 300, that is, the measured current values, and a communicator 350 for sending data such as the measured current values and/or the like to other devices such as a computer.

A conductor 110 such as a conducting plate, for example, is disposed on the first terminal block 100. The L1-phase electric line 20 is connected as a primary electric line to one end 110a of the conductor 110. A secondary electric line 25 is connected to the other end 110b of the conductor 110. Also, a detection coil 120 comprising a pair of detection coils 120a and 120b is disposed on the first terminal block 100. An inductive voltage signal in accordance with a magnetic field generated in the surroundings by alternating current flowing in the conductor 110 is output from the detection coil 120 to the current calculator 300.

The second terminal block 200 is configured in a similar manner to the first terminal block 100. That is to say, a conductor 110 is disposed on the second terminal block 200. The L2-phase electric line 30 is connected as a primary electric line to one end 110a of the conductor 110. A secondary electric line 35 is connected to the other end 110b of the conductor 110, and a detection coil 130 comprising a pair of detection coils 130a and 130b is arranged. An inductive voltage signal in accordance with a magnetic field generated in the surroundings by alternating current flowing in the conductor 110 of the second terminal block 200 is output from the detection coil 130 to the current calculator 300. The detection coil 130 is configured in a similar manner to the detection coil 120, and so the below description focuses on the detection coil 120.

The current calculator 300 comprises a differential amplifier 310a and an A/D (analog/digital) converter 320a for the first terminal block 100, a differential amplifier 310b and an A/D converter 320b for the second terminal block 200, and an arithmetic processor 330.

The differential amplifier 310a differentially amplifies the inductive voltage signal from the detection coil 120. The A/D converter 320a converts the analog signal that has been differentially amplified by the differential amplifier 310a into a digital signal.

The differential amplifier 310b differentially amplifies the inductive voltage signal from the detection coil 130. The A/D converter 320b converts the analog signal that has been differentially amplified by the differential amplifier 310b into a digital signal.

The arithmetic processor 330 calculates the alternating-current values of the conductors 110 on the first terminal block 100 and the second terminal block 200 by arithmetically processing the digital signals from the A/D converters 320a and 320b, respectively. Specifically, the arithmetic processor 330 calculates the values of the alternating currents flowing in the L1-phase electric line 20 and the L2-phase electric line 30 by arithmetically processing, using the below-described arithmetic equations, the digital signals that have undergone A/D conversion by the A/D converters 320a and 320b, respectively.

The power source circuit 400 rectifies and smooths power source voltage from the L1-phase electric line 20 connected to the first terminal block 100, and generates power source voltage necessary for driving the current calculator 300.

Figure 2A:
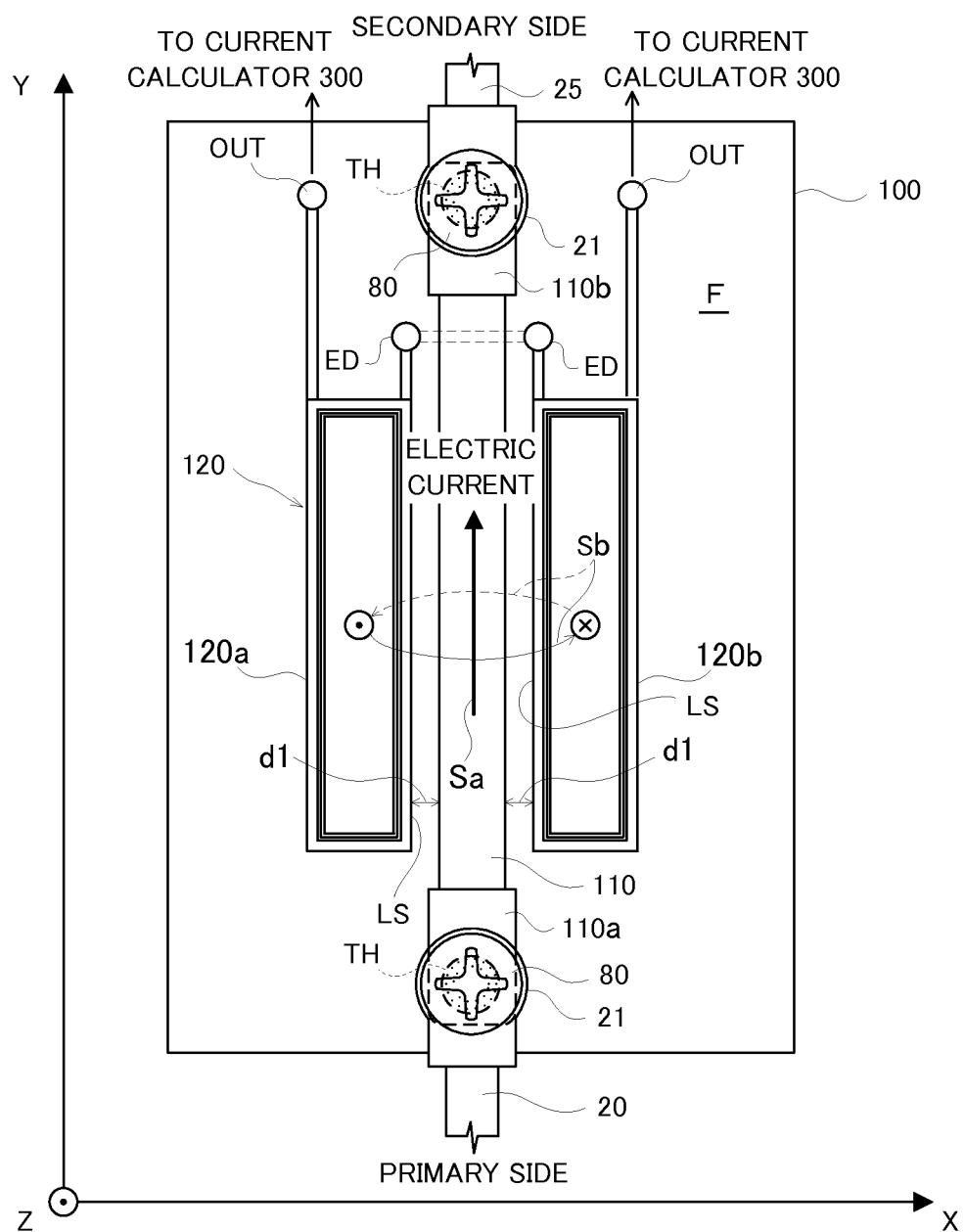
FIG. 2A is a planar view of a first terminal block of the current measurement device according to the first embodiment.
Figure 2B:
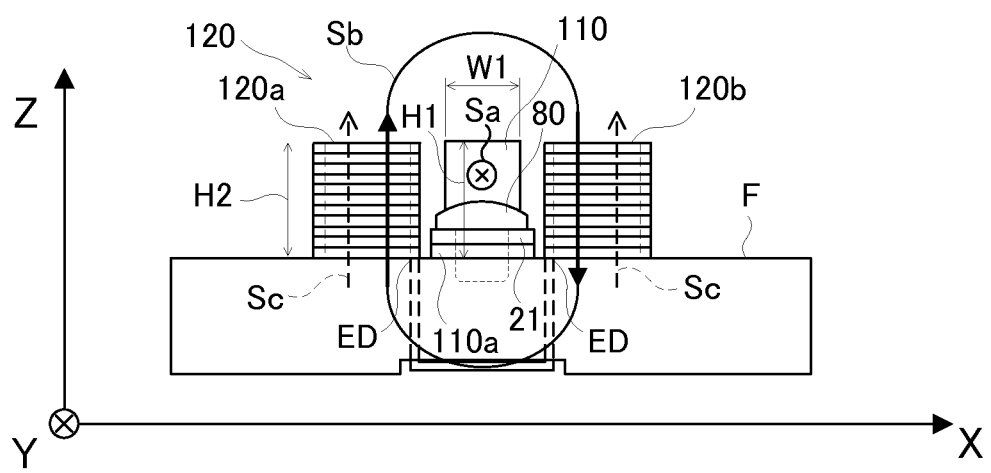
FIG. 2B is a side view of the first terminal block of the current measurement device according to the first embodiment.

Now, the configuration of the first terminal block 100 is described. As shown in FIGS. 2A and 2B, the first terminal block 100 has an electrically insulating placement surface F on which the conductor 110 is disposed. The conductor 110 is made of a metal material such as copper and/or the like, and has a long, slender plate-like shape. The conductor 110 is fixed to the placement surface F by screws. In addition, the conductor 110 has a height H1 that is longer than the width W1, as shown in FIG. 2B.

Moreover, the L1-phase electric line 20 is connected to the one end 110a of the conductor 110 by a screw 80 inserted into a pressure terminal 21 at a tip of the L1-phase electric line 20 being screwed into a connection female screw hole TH formed in the one end 110a of the conductor 110. Also, the secondary electric line 25 is connected to the other end 110b of the conductor 110 by a screw 80 inserted into a pressure terminal 21 at a tip of the secondary electric line 25 being screwed into a connection female screw hole TH formed in the other end 110b of the conductor 110.

In addition, the detection coils 120a and 120b are disposed symmetrically on the placement surface F of the first terminal block 100, such that the conductor 110 is positioned between the detection coils 120a and 120b. The detection coils 120a and 120b are so-called hollow-core coils with no magnetic metal and/or the like as the core material, as shown in FIG. 2A. The detection coils 120a and 120b may also be disposed unsymmetrically, with the conductor 110 therebetween.

When, for example, alternating current from the L1-phase electric line 20 flows in the conductor 110 in a direction indicated by an arrow Sa in FIGS. 2A and 2B, a magnetic field directly proportional to the magnitude of the current is generated around the conductor 110. That is to say, magnetic flux indicated by a ring-shaped arrow Sb in FIGS. 2A and 2B is linked with the detection coils 120a and 120b.

The detection coils 120a and 120b have the same configuration. That is to say, these are coils with the same parameters (hereinafter referred to as "coil parameters") for determining coil properties, such as the number of windings, coil cross-sectional area, winding height, winding direction, winding material and/or the like. Also, the winding shape thereof (that is to say, the coil cross-sectional shape) is a rectangular shape, as shown in FIG. 2A. In addition, as shown in FIG. 2B, the detection coils 120a and 120b each have a winding height H2 that is approximately the same as the height H1 of the conductor 110, which is longer than the width W1 of the conductor 110.

Furthermore, the detection coils 120a and 120b are disposed on the placement surface F of the first terminal block 100 such that the long side LS of each coil is parallel to the direction of conduction of the conductor 110, and an insulating distance d1 for insulation from the conductor 110 is provided between each coil and the conductor 110. Accordingly, it is not required to place an insulating sheet and/or the like between the conductor 110 and each of the detection coils 120a and 120b.

In addition, the detection coils 120a and 120b are connected to each other in series and in opposite polarity so that the changes in the inductive voltage signals generated by the conductor 110 are opposite. One end ED of the detection coil 120a and one end ED of the detection coil 120b are connected at the back surface of the first terminal block 100, as indicated by the broken lines in FIGS. 2A and 2B. The other end of each of the detection coils 120a and 120b is connected to an output terminal OUT, which is connected to the current calculator 300, as shown in FIG. 2A. The ends ED of the detection coils 120a and 120b may be mutually connected at a position that is not the back surface of the first terminal block 100, and these ends ED may be connected on the placement surface F side or inside the first terminal block 100.

Next, current measurement by the current measurement device 10 configured as above is described below. Linkage flux generated around the conductor 110 in direct proportion to the magnitude of the time derivative of the current flowing in the L1-phase electric line 20, and magnetic flux of the external magnetic field that is magnetic noise are linked with the detection coils 120a and 120b, and inductive voltage signals in accordance with the change in the linkage flux are generated in the detection coils 120a and 120b.

As shown in FIGS. 2A and 2B, when the current is flowing in the conductor 110 in the direction of the arrow Sa, which is the direction of the positive Y-axis, linkage flux is generated in the X-Z plane orthogonal to the conductor 110, around the conductor 110. The generated linkage flux is centered on the conductor 110 and is in the direction of the ring-shaped arrow Sb, which is clockwise when viewed from the direction of the arrow Sa. As shown in FIG. 2B, the magnetic flux in the positive Z-axis direction is linked with the detection coil 120a, and the magnetic flux in the negative Z-axis direction is linked with the detection coil 120b.

The detection coils 120a and 120b are coils with the same coil parameters. Hence, the absolute values of the inductive voltage signals generated in the detection coils 120a and 120b in accordance with the changes in the magnetic field generated by the conductor 110 are the same, and the orientation of the linkage flux generated by the conductor 110 in the direction of the ring-shaped arrow Sb is opposite between the detection coils 120a and 120b, as shown in FIG. 2B, so the phases of the inductive voltage signals thereof are opposite.

Also, the magnetic flux of the external magnetic field that is magnetic noise is linked with the detection coils 120a and 120b in the same direction, as indicated by a wavy arrow Sc in FIG. 2B. Because peripheral equipment, the current calculator 300, the power source circuit 400 and/or the like as generation sources of the external magnetic field are relatively far from the pair of detection coils 120a and 120b as compared to the distance between the conductor 110 and each of the detection coils 120a and 120b, the magnetic flux of the external magnetic field is linked with the pair of detection coils 120a and 120b in the same direction.

The detection coils 120a and 120b are arranged under a common external magnetic field, and have the same coil parameters, as discussed above. Consequently, the absolute values of the inductive voltage signals generated in the detection coils 120a and 120b by the external magnetic field are the same, and the magnetic flux of the external magnetic field is linked with the detection coils 120a and 120b in the same direction as indicated by the dashed arrows in FIG. 2B, so the inductive voltage signals of the detection coils 120a and 120b are in the same phase.

As discussed above, the detection coils 120a and 120b are connected to each other in series and in opposite polarity, and the inductive voltage signals generated in the detection coils 120a and 120b are summed. That is to say, the output level of the inductive voltage signals caused by the magnetic field generated by the conductor 110 is twice higher than the output level obtained when the detection coil 120a or 120b is used alone, while the inductive voltage signals caused by the external magnetic field are offset relative to each other.

The inductive voltage signal V at the output terminal OUT of the first terminal block 100 is expressed by the following equation (1).

$$V=(V1+Vno)-(-V1+Vno) \tag{1}$$

Here, the first term on the right side of the equation (1) indicates an inductive voltage signal generated in the detection coil 120a, and the second term on the right side of the equation (1) indicates an inductive voltage signal generated in the detection coil 120b. V1 represents an inductive voltage from the linkage flux of the conductor 110, and Vno represents an inductive voltage from the external magnetic field.

The inductive voltage signal V at the output terminal OUT of the first terminal block 100 is input into the current calculator 300, as shown in FIG. 1. The current calculator 300 calculates the value of alternating current flowing in the L1-phase electric line 20 on the basis of the inductive voltage signal V. Specifically, the inductive voltage signal V is differentially amplified by the differential amplifier 310a. This amplified signal undergoes A/D conversion by the A/D converter 320a. The arithmetic processor 330 processes the A/D converted digital signal, and calculates the value of the alternating current flowing in the L1-phase electric line 20.

The arithmetic processor 330 calculates the value of the alternating current flowing in the L1-phase electric line 20 by arithmetically processing the inductive voltage signal at the output terminal OUT of the first terminal block 100 using the Biot-Savart Law and Faraday's Law.

Equation (2), based on the Biot-Savart Law, shows a magnetic field H at a point P around an infinitely long linear current I(t). Assume that from the linear current I(t) to the point P is a distance r.

$$H = I(t)/2\pi r \quad (2)$$

Furthermore, the flux density B in a vacuum is expressed by equation (3). Also, $\mu_0$ is the magnetic permeability in a vacuum.

$$B = \mu_0 \cdot H \quad (3)$$

When equation (2) is substituted into equation (3), equation (4) is obtained.

$$B = \mu_0 \cdot I(t)/2\pi r \quad (4)$$

The magnetic flux $\phi$ linked with a coil is obtained by integrating the flux density B over the area of the coil opening. Supposing that the opening of the coil linked with the magnetic flux is formed across a length $L_0$ along the current path and a length extending from a position $r_1$ spaced from the current path to a position $r_2$ that is further spaced from the current path, the magnetic flux $\phi$ linked with a coil having such opening is obtained by integrating the flux density B across the range from 0 to $L_0$ for the current path L and across the range from $r_1$ to $r_2$ for the distance r. This integral equation is the below equation (5). When this equation (5) is solved, equation (6) is derived.

(Formula 1)

$$\phi = \int_{\varepsilon} B\,ds = \int_0^{L_0} \int_{r_1}^{r_2} \frac{\mu_0 \cdot I \cdot (t)}{2\pi r} dL \cdot dr \quad (5)$$

(Formula 2)

$$\phi = \frac{\mu_0 \cdot I(t)}{2\pi} \cdot L_0 \cdot \left[\log \frac{r_2}{r_1}\right] \quad (6)$$

Next, equation (7) according to Faraday's Law shows that the inductive voltage V generated in the coil is proportional to the change per unit time in the magnetic flux $\phi$ penetrating the coil. Here, k is the number of windings of the coil.

$$V(t) = -k \cdot d\phi(t)/dt \quad (7)$$

Furthermore, when the magnetic flux $\phi$ of equation (6) is substituted into equation (7), equation (8) indicating the relationship between the inductive voltage V(t) and the flowing current I(t) is obtained. When equation (8) is solved, equation (9) is derived. The flowing current I(t) is expressed as $I_0 \cdot \sin \omega t$.

(Formula 3)

$$V(t) = -\frac{k \cdot \mu_0 \cdot L_0}{2\pi} \cdot \log\left(\frac{r_2}{r_1}\right) \cdot \frac{I_0 \cdot \sin \omega t}{dt} \quad (8)$$

(Formula 4)

$$V(t) = -\frac{\omega \cdot k \cdot \mu_0 \cdot L_0}{2\pi} \cdot \log\left(\frac{r_2}{r_1}\right) \cdot I_0 \cdot \cos \omega t \quad (9)$$

In addition, V(t) is expressed as $V_0 \cdot \cos \omega t$, and when this is substituted into equation (9) to simplify both sides, equation (10) is obtained.

(Formula 5)

$$I_0 = \frac{V_0}{\left(-\frac{\omega \cdot k \cdot \mu_0 \cdot L_0}{2\pi} \cdot \log\left(\frac{r_2}{r_1}\right)\right)} \quad (10)$$

Furthermore, by substituting the inductive voltage value obtained from the output terminal OUT of the first terminal block 100 for the inductive voltage $V_0$ in equation (10), the value $I_0$ of the alternating current flowing in the L1-phase electric line 20 is calculated.

In addition, the current calculator 300 calculates the value $I_0$ of the alternating current flowing in the L2-phase electric line 30 by processing the inductive voltage signal V from the output terminal OUT of the second terminal block 200 in a similar manner to the above-described case of the first terminal block 100.

In addition, the display 340 displays the alternating current values of the L1-phase electric line 20 and the L2-phase electric line 30 that are calculated by the current calculator 300. In addition, the communicator 350 sends data, such as the measured alternating current values of the L1-phase electric line 20 and the L2-phase electric line 30 and/or the like, to other information processing devices such as a computer and/or the like.

As described above, with the current measurement device 10 according to the first embodiment of the present disclosure, the detection coils 120a and 120b, having the same configuration, are arranged symmetrically on the placement surface F of the first terminal block 100 with the conductor 110 therebetween, and each coil is arranged near the conductor 110, at a position separated by an insulating distance d1 from the conductor 110. Such arrangement does not require an insulating sheet, thereby simplifying the configuration. Also, the second terminal block 200 has efficacy similar to that of the first terminal block 100.

In addition, because the detection coils 120a and 120b are disposed symmetrically on the placement surface F of the first terminal block 100 with the conductor 110 therebetween, it is possible for the influence of the external magnetic field on the pair of detection coils 120a and 120b to be the same. That is to say, it is possible to improve on the fact that the influence of the external magnetic field differs between the detection coil on the front surface and the detection coil on the back surface. Furthermore, the detection coils 120a and 120b are connected to each other in series and in opposite polarity, so the external magnetic field can be effectively offset and it becomes possible to obtain with high accuracy an inductive voltage signal proportional to the magnitude of the time derivative of the alternating current of the L1-phase electric line 20 connected to the first terminal block 100. Accordingly, it is possible to calculate with high accuracy the alternating current of the L1-phase electric line 20 of the conductor 110 on the basis of this inductive voltage signal. In addition, the second terminal block 200 has efficacy similar to that of the first terminal block 100, and thus it is possible to calculate with high accuracy the alternating current of the L2-phase electric line 30 of the conductor 110.

In addition, with the current calculation method according to the first embodiment of the present disclosure, the detection coils 120a and 120b, having the same configuration, are disposed on the placement surface F of the first terminal block 100 with the conductor 110 therebetween, and each coil is spaced from the conductor 110 by an insulating distance d1. Furthermore, the detection coils 120a and 120b are connected to each other in series and in opposite polarity. The current calculator 300 calculates the to-be-measured current value on the basis of the inductive voltage signal from the pair of detection coils 120a and 120b. Accordingly, an insulating sheet is unnecessary, thereby simplifying the configuration, and it is possible to accomplish highly accurate current measurements.

In addition, as shown in FIG. 2B, the height H1 of the conductor 110 is longer than the width W1. Consequently, it is possible to configure the winding height H2 of the detection coils 120a and 120b to be long in the same direction as that of the height H1 of the conductor 110.

As shown in FIG. 2A, the detection coils 120a and 120b each have a rectangular cross-section, and the detection coils 120a and 120b are disposed near the conductor 110 so that the long side LS thereof is parallel with the conducting direction of the conductor 110. Consequently, the signal-noise ratio (S/N ratio) of the inductive voltage signals of the detection coils 120a and 120b is large. That is to say, it is possible to reduce the output level of the inductive voltage signal caused by the external magnetic field and to increase the output level of the inductive voltage signal generated by the conductor 110. The reasons for this are explained below.

Figure 3:
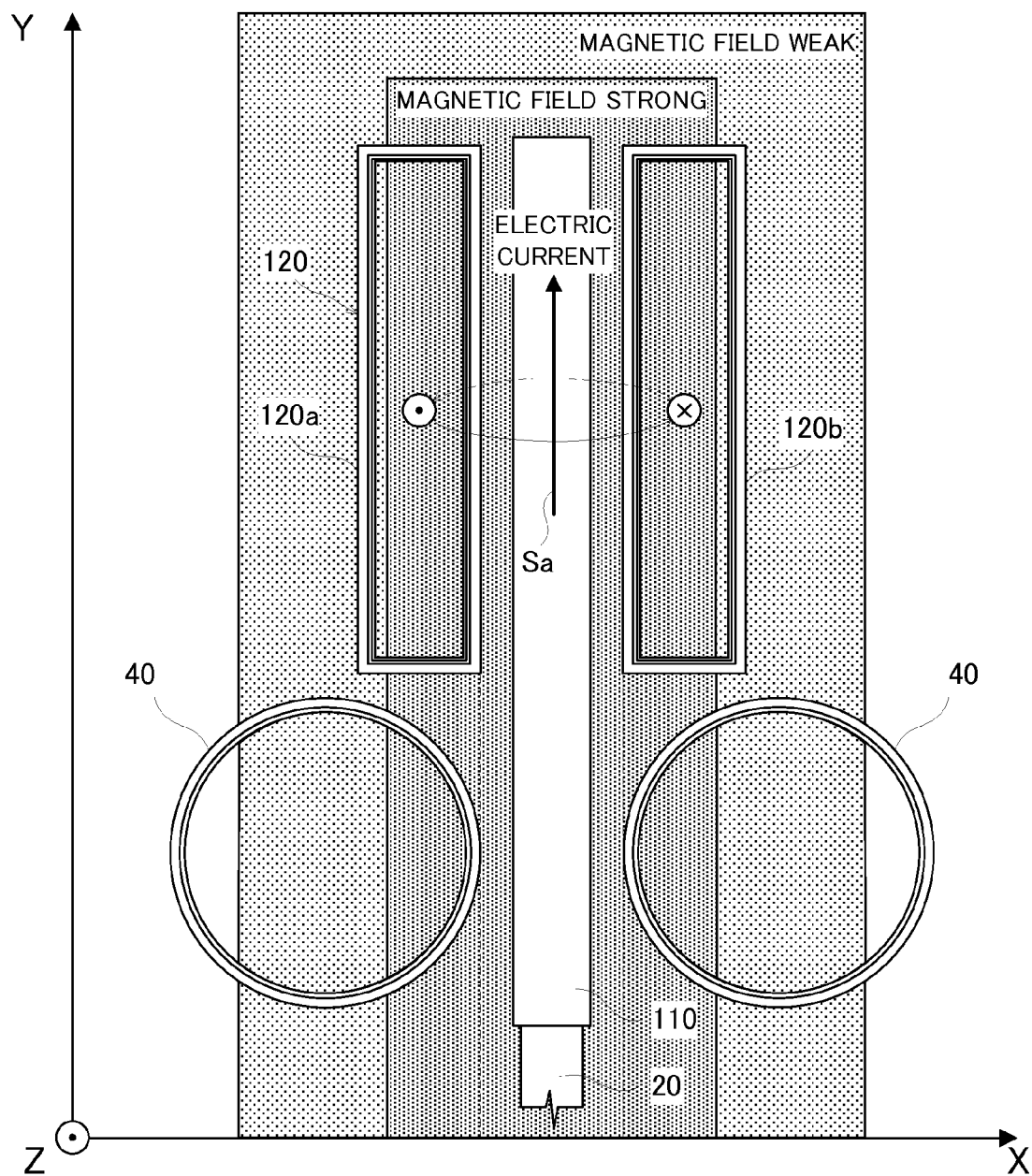
FIG. 3 is a drawing showing detection coils and circular detection coils according to the first embodiment.

It is assumed that the rectangular detection coils 120a and 120b and circular detection coils 40 are arranged at positions equidistant from the conductor 110, as shown in FIG. 3. The circular detection coils 40 differ only in coil shape from the detection coils 120a and 120b, and all other coil parameters are the same.

As the strength of the magnetic field generated by the conductor 110 is inversely proportional to the distance from the conductor 110, the change in magnetic flux linked with the detection coils 120a and 120b is greater than the change in magnetic flux linked with the circular detection coils 40. Consequently, the detection coils 120a and 120b output a higher output level of inductive voltage signal, as compared to the circular detection coils 40. That is to say, by configuring the detection coils 120a and 120b to each have a rectangular cross-section and by positioning these detection coils near the conductor so that the long side LS of each detection coil is parallel to the direction of conduction of the conductor 110, the S/N ratio can be increased as compared to the circular detection coils 40 having the same coil parameters, and highly accurate current detection can be accomplished.

Furthermore, by configuring the detection coils 120a and 120b to each have a rectangular cross-section that extends in the direction of the long side LS of each coil, it is possible to make the detection coils with the same S/N ratio more compact than the circular detection coils 40.

In addition, in this embodiment, the pair of detection coils 120a and 120b is disposed on the placement surface F of the first terminal block 100 such that each coil is near the conductor 110, and thus it is possible to easily mount the two detection coils. In addition, neither a specially-shaped terminal block for protecting the detection coil 120 on the back surface of the conductor 110, nor complex assembly work is required.

Figure 4:
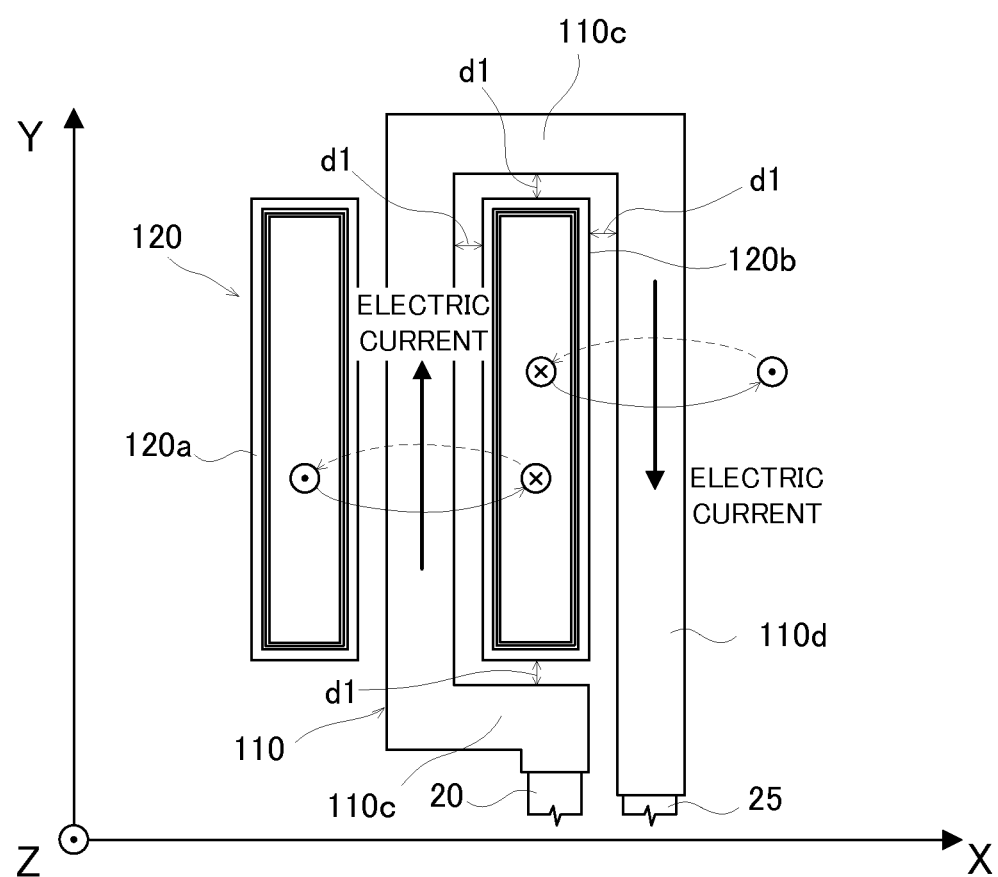
FIG. 4 is a drawing showing a configuration in which the conductor according to the first embodiment surrounds one of the detection coils.

The shape of the conductor 110 of this embodiment is not limited to the linear shape as shown in FIG. 2A. The conductor 110 may have a shape that encompasses the outer circumference of the detection coil 120b, as shown in FIG. 4. In this case, the linkage flux generated around each part 110c of the conductor 110 extending in the positive X-axis direction and the negative X-axis direction and the part 110d of the conductor 110 extending in the negative Y-axis direction is also linked with the detection coil 120b. Consequently, the output level of the inductive voltage signal of the detection coil 120b caused by the magnetic field generated by the conductor 110 is high, as compared to the case of the conductor 110 having a linear shape as shown in FIG. 2A. The conductor 110 may have a shape that surrounds the outer circumference of the detection coil 120a.

Figure 5:
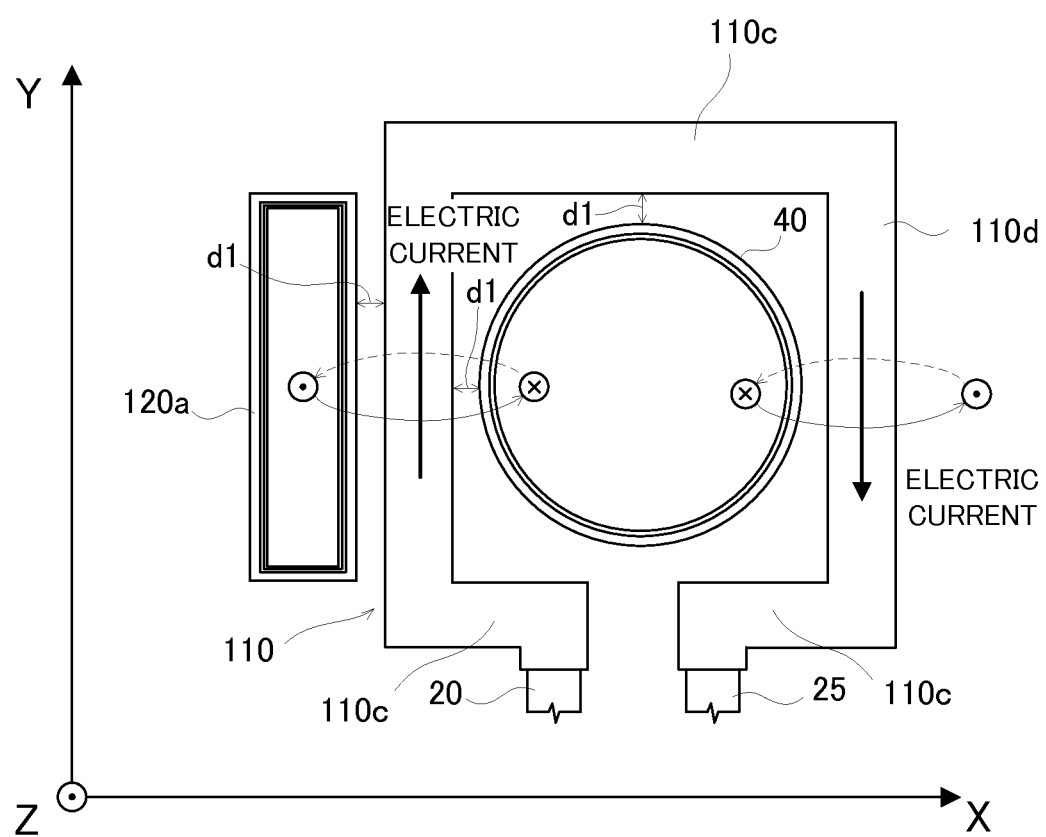
FIG. 5 is a drawing showing a configuration in which a conductor according to a variation surrounds one of the circular detection coils.

In addition, as shown in FIG. 5, the detection coil 120b (or the detection coil 120a) may be changed to a circular detection coil 40, and the conductor 110 may have a shape surrounding the outer circumference of the circular detection coil 40. The magnetic flux, generated around each part 110c of the conductor 110 extending in the positive X-axis direction and the negative X-axis direction and the part 110d of the conductor 110 extending in the negative Y-axis direction, is also linked with the detection coil 40. Consequently, it is possible to increase the output level of the inductive voltage signal by the amount surrounded by the conductor 110, as compared to the circular detection coil 40 that is not surrounded by the conductor 110 shown in FIG. 3.

Furthermore, in this embodiment, the detection coils 120a and 120b each have a rectangular shape as shown in FIG. 2A, but each coil may have a square shape. If each coil has a square shape, the S/N ratio is low as compared to a rectangular-shaped coil with the same coil parameters, but it is possible to reduce the aspect ratio of the coil cross-section, offering the advantage that processing is easier.

Second Embodiment

Next, a current measurement device 11 according to a second embodiment of the present disclosure is described. In the description below, constituent elements common with the first embodiment are denoted by the same reference signs.

Figure 6:
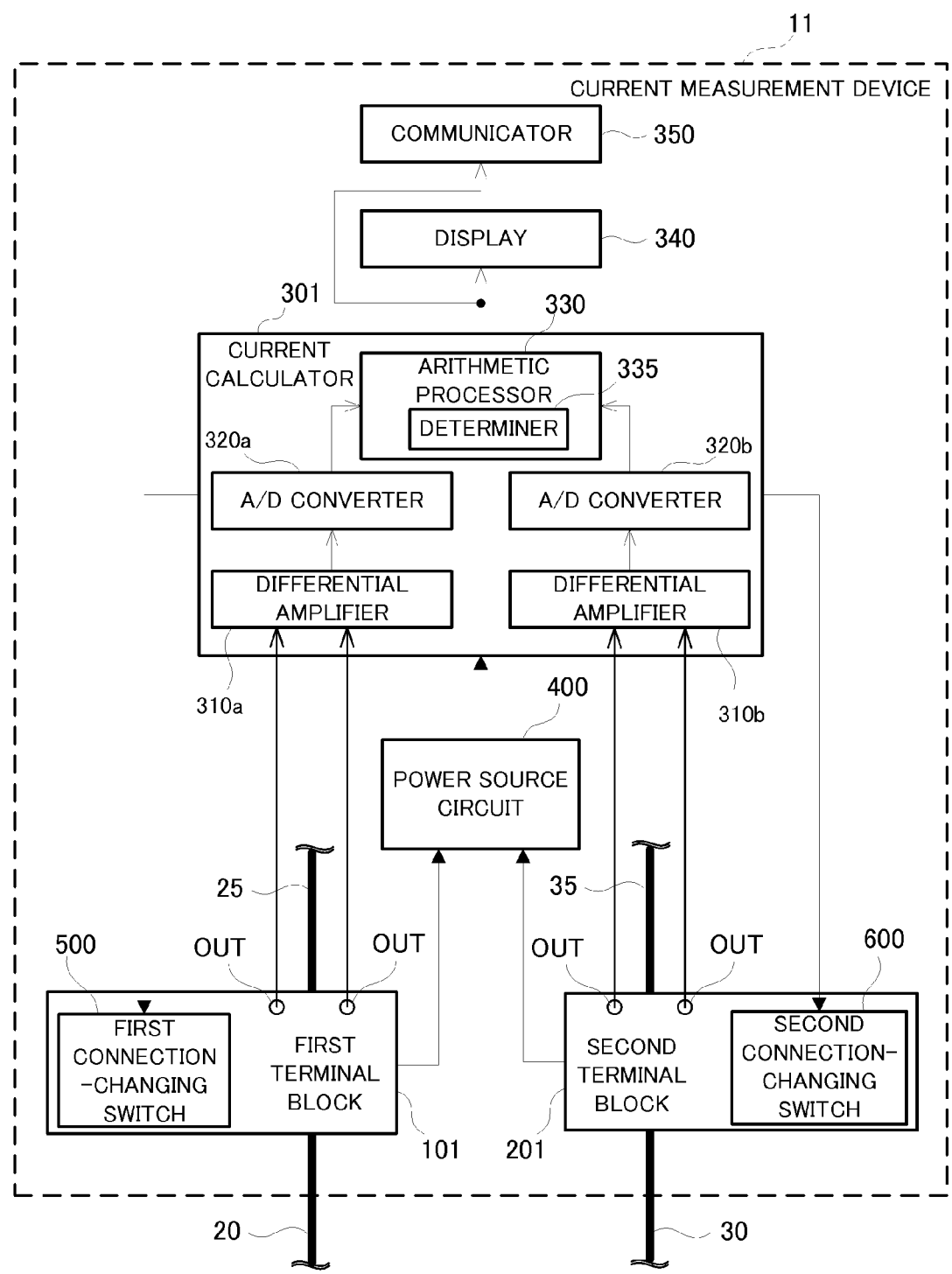
FIG. 6 is a configuration diagram of a current measurement device according to a second embodiment of the present disclosure.
Figure 7:
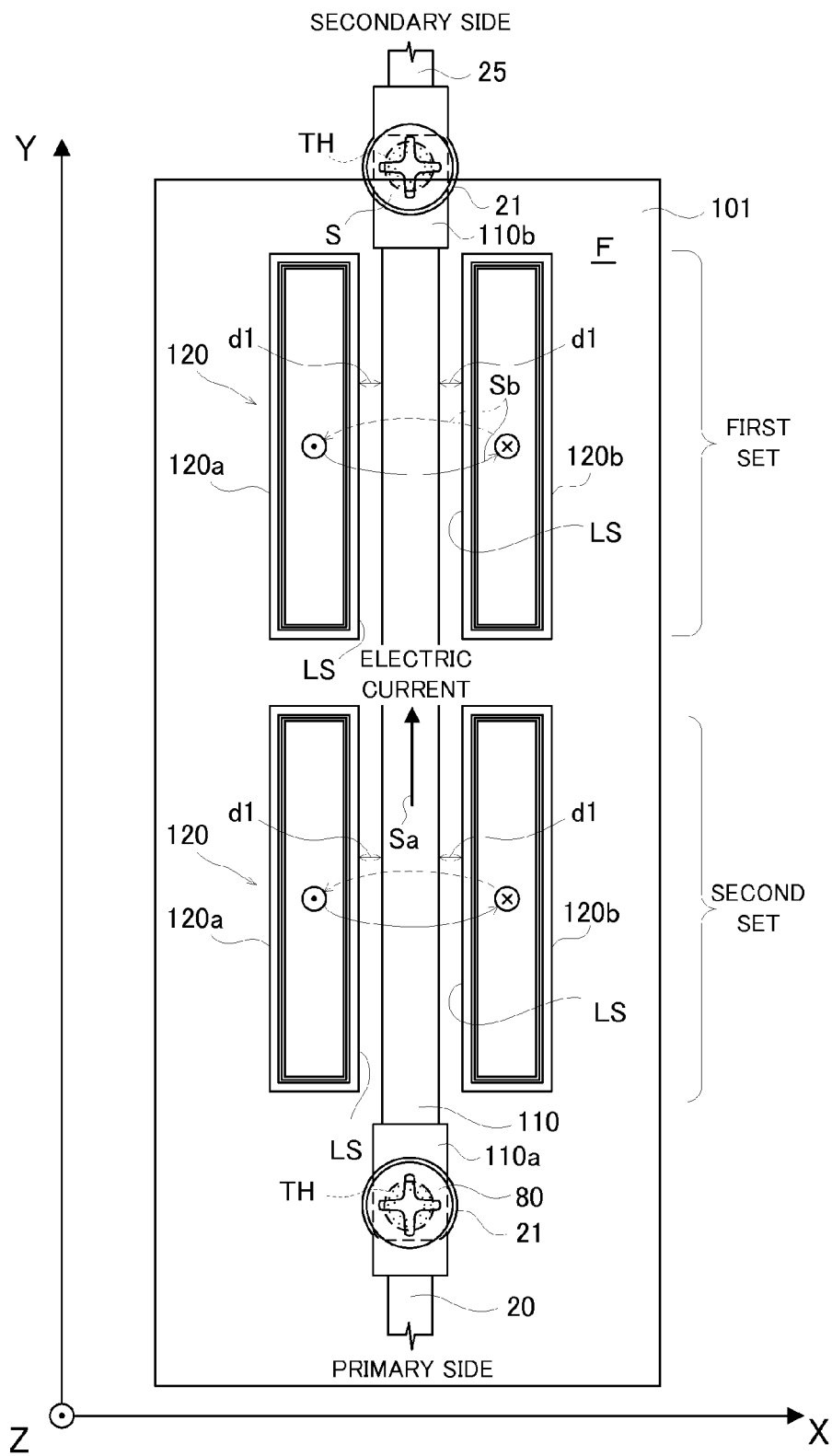
FIG. 7 is a configuration diagram of a first terminal block of the current measurement device according to the second embodiment of the present disclosure.

In the current measurement device 10 according to the above-described first embodiment, only one pair of detection coils 120a and 120b is disposed on the first terminal block 100, and only one pair of detection coils 130a and 130b is disposed on the second terminal block 200, as shown in FIG. 1. In contrast, in the current measurement device 11 according to the second embodiment, two pairs of detection coils 120a and 120b are disposed along a conductor 110 on a first terminal block 101, as shown in FIG. 7, and a first connection-changing switch 500 that changes the connection of the two pairs of detection coils 120a and 120b is provided, as shown in FIG. 6. Also, a second terminal block 201 is configured in a similar manner to the first terminal block 101. Specifically, two pairs of detection coils 130a and 130b are disposed along the conductor 110 on the second terminal block 201, and a second connection-changing switch 600 that changes the connection of the two pairs of detection coils 130a and 130b is provided.

As shown in FIG. 6, the current measurement device 11 according to the second embodiment comprises a first terminal block 101 to which an L1-phase electric line 20 is connected, a second terminal block 201 to which an L2-phase electric line 30 is connected, a current calculator 301 that calculates alternating current values of the L1-phase electric line 20 and the L2-phase electric line 30, a power source circuit 400 that generates power source voltage, a first connection-changing switch 500 disposed on the first terminal block 101 and a second connection-changing switch 600 disposed on the second terminal block 201.

Figure 8:
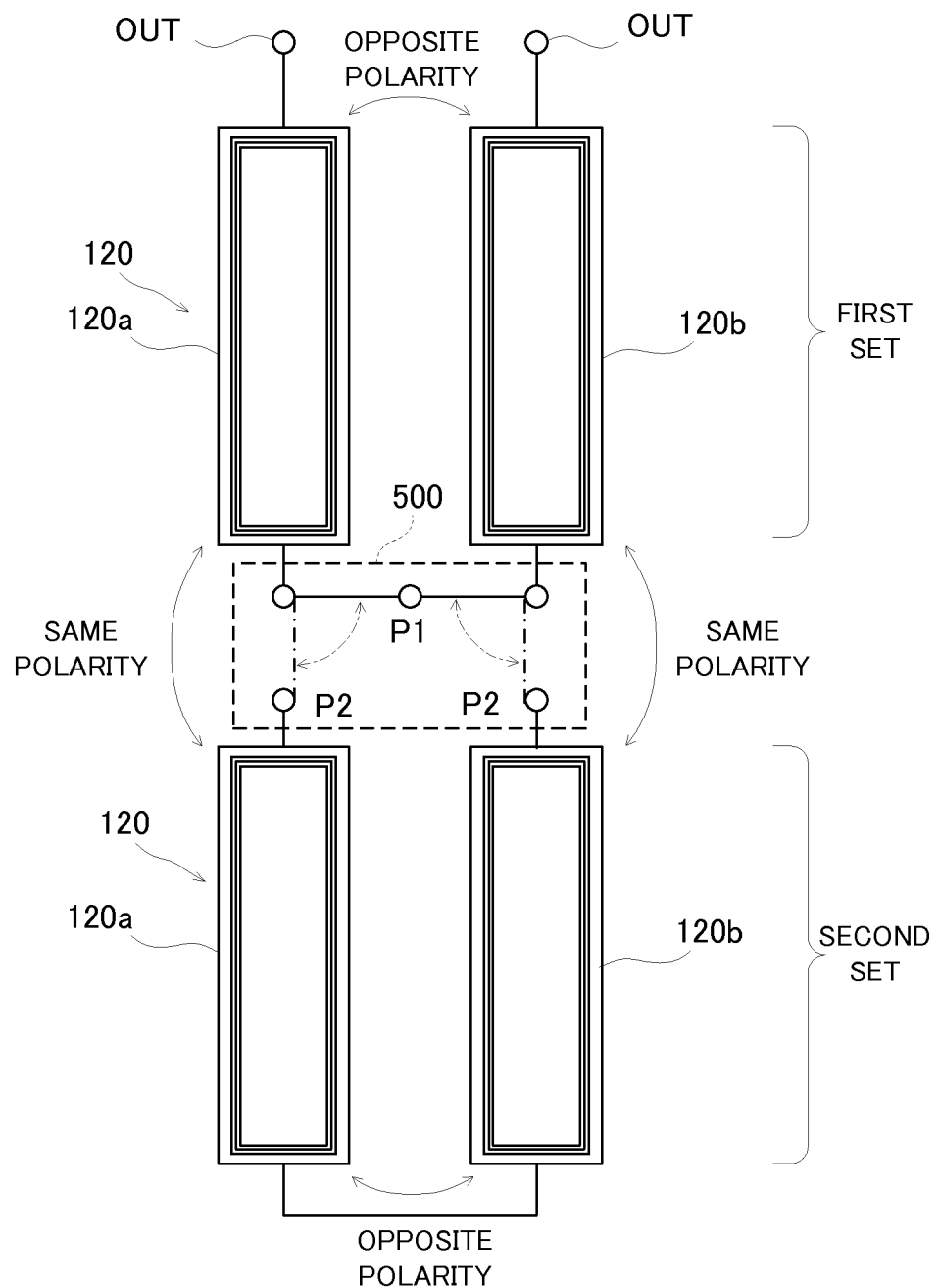
FIG. 8 is a connection diagram of detection coils according to the second embodiment.

Two detection coils 120 are disposed on the first terminal block 101. The first connection-changing switch 500 switches the two detection coils 120 disposed on the first terminal block 101 so that only one detection coil 120 is used or two detection coils 120 are used. That is to say, the first connection-changing switch 500 performs switching between a one-pair connection with only one pair of detection coils 120a and 120b, and a two-pair connection with two pairs of detection coils 120a and 120b connected. The two-pair connection refers to, as shown in FIG. 8, an arrangement in which two detection coils 120a on the left side of the conductor 110 are connected in series and in the same polarity, two detection coils 120b on the right side of the conductor 110 are connected in series and in the same polarity, and the two detection coils 120a on the left side and the two detection coils 120b on the right side are connected in opposite polarity with respect to each other.

Two detection coils 130 are disposed on the second terminal block 201 as well. The second connection-changing switch 600 switches the two detection coils 130 disposed on the second terminal block 201 so that only one detection coil 130 is used or two detection coils 130 are used. That is to say, the second connection-changing switch 600 performs switching between a one-pair connection with only one pair of detection coils 130a and 130b, and a two-pair connection with the two pairs of detection coils 130a and 130b connected.

The current calculator 301 comprises differential amplifiers 310a and 310b that differentially amplify inductive voltage signals from output terminals OUT of the first terminal block 101 and the second terminal block 201, respectively, A/D converters 320a and 320b that convert the differentially-amplified analog signals into digital signals, and an arithmetic processor 330 for arithmetically processing the digital signals to calculate the alternating current values of the conductors 110 on the first terminal block 101 and the second terminal block 201.

The power source circuit 400 is similar to that of the first embodiment and rectifies and smooths power source voltage from the L1-phase electric line 20 connected to the first terminal block 101 to generate power source voltage necessary for driving the current calculator 301.

The first connection-changing switch 500 is a hardware switch that changes the pair of detection coils 120a and 120b disposed on the first terminal block 101 to a one-pair connection or a two-pair connection, on the basis of a control signal from the current calculator 301. The second connection-changing switch 600 is a hardware switch that changes the pair of detection coils 130a and 130b disposed on the second terminal block 201 to a one-pair connection or a two-pair connection, on the basis of a control signal from the current calculator 301.

The first terminal block 101 has an insulating placement surface F on which the conductor 110 is disposed, as shown in FIG. 7. On the placement surface F, two pairs of detection coils 120a and 120b are disposed symmetrically, with the conductor 110 therebetween. The first pair of detection coils 120a and 120b is disposed to the positive Y-axis direction side, with respect to the second pair of detection coils 120a and 120b.

The first pair of detection coils 120a and 120b and the second pair of detection coils 120a and 120b are disposed such that the long sides LS thereof are parallel to the direction of conduction of the conductor 110, and are disposed on the placement surface F of the first terminal block 101 at an insulating distance d1 from the conductor 110. Accordingly, it is not required to place an insulating sheet and/or the like between each pair of detection coils 120a and 120b and the conductor 110.

As shown in FIG. 8, the first pair of the detection coils 120a and 120b is connected to the first connection-changing switch 500 in a state where the detection coils 120a and 120b are connected in series and in opposite polarity so that the changes in the inductive voltage signals generated by the conductor 110 are opposite, and the second pair of the detection coils 120a and 120b is also connected to the first connection-changing switch 500 in a state where the detection coils 120a and 120b are connected in series and in opposite polarity so that the changes in the inductive voltage signals generated by the conductor 110 are opposite. Furthermore, when the first connection-changing switch 500 accomplishes the switch change as indicated by the dotted line, the first pair of detection coils 120a and 120b and the second pair of detection coils 120a and 120b are in a connected state. Specifically, the two detection coils 120a on one side (for example, the left side) of the conductor 110 are connected in series and in the same polarity, the two detection coils 120b on the other side (for example, the right side) of the conductor 110 are connected in series and in the same polarity, and the detection coils 120a and 120b of the second pair are connected in series and in opposite polarity. That is to say, the two detection coils 120a on the left side of the conductor 110 and the two detection coils 120b on the right side of the conductor 110 are in opposite polarity.

Next, current measurement by the current measurement device 11 configured as above is described below.

First, the first connection-changing switch 500 is connected to a first contact point P1 as indicated by the solid line in FIG. 8, and the coils 120a and 120b of the first pair are connected to each other in series and in opposite polarity. The detection coils 120a and 120b of the second pair are also connected to each other in series and in opposite polarity, but are not connected to the first pair of detection coils 120a and 120b.

Then, alternating current is supplied to the L1-phase electric line 20, and a magnetic field in accordance with the alternating current is generated around the conductor 110. A magnetic field generated in direct proportion to the magnitude of the alternating current in the conductor 110 and magnetic flux of the external magnetic field that is magnetic noise are linked with the first pair of detection coils 120a and 120b, and an inductive voltage signal directly proportional to the change in the linkage flux is generated in each of the detection coils 120a and 120b. The detection coils 120a and 120b of the first pair are connected to each other in series and in opposite polarity, similar to the first embodiment, so the influence of the external magnetic field is offset and inductive voltage signal outputs caused by the magnetic field generated by the conductor 110 are summed. That is to say, an inductive voltage signal V directly proportional to the time derivative of the alternating current flowing in the L1-phase electric line 20 is input into the current calculator 300 from the output terminals OUT of the first terminal block 101, as shown in FIG. 6.

The current calculator 301 calculates the value of the alternating current flowing in the L1-phase electric line 20 on the basis of the inductive voltage signal V. Specifically, the inductive voltage signal V is differentially amplified by the differential amplifier 310a. The amplified signal undergoes A/D conversion by the A/D converter 320a. The arithmetic processor 330 arithmetically processes the A/D converted digital signal and calculates the value of the alternating current flowing in the L1-phase electric line 20.

Furthermore, the current calculator 301 comprises a determiner 335 for determining whether or not the calculated alternating current value is greater than a reference value.

For example, this reference value is an alternating current value obtained in the case of a value no greater than half of the maximum inductive voltage signal value detectable by one pair of the detection coils 120a and 120b. For example, when the alternating current value calculated by the current calculator 301 is lower than the reference value, that is to say, when the alternating current to the conductor 110 is small, the current calculator 301 outputs a control signal, and the first connection-changing switch 500 changes the connection to a second contact point P2 as indicated by the dotted line in FIG. 8, on the basis of the control signal from the current calculator 301, so that the first pair of detection coils 120a and 120b and the second pair of detection coils 120a and 120b are in connected state.

That is to say, the two detection coils 120a on the left side of the conductor 110 are connected in series and in the same polarity, the two detection coils 120b on the right side of the conductor 110 are connected in series and in the same polarity, and the detection coils 120a and 120b of the second pair are connected in series and in opposite polarity. That is to say, it is possible to obtain a greater inductive voltage signal by the increase in the number of detection coils.

A set value, indicating how many sets of pairs of the detection coils 120a and 120b are connected, is "1" when one pair of detection coils 120a and 120b is connected, and the set value is "2" when two pairs of detection coils 120a and 120b are connected. By changing the set value from "1" to "2", it is possible to increase, while offsetting the external magnetic field, the output of the inductive voltage signal caused by the magnetic field generated by the conductor 110 by a factor of the number of connection pairs (here, double), as compared to the first embodiment. Accordingly, even when a small alternating current is flowing in the L1-phase electric line 20, it is possible to obtain an inductive voltage signal directly proportional to the magnitude of that current with high accuracy. In the current calculator 301, the number of connection pairs of detection coils 120a and 120b is "2", so the alternating current value is calculated on the basis of this inductive voltage signal, and this alternating current value is divided by the number of connection pairs "2" to obtain a final alternating current value.

The current calculator 301 switches analysis parameters, such as the quantization coefficient and/or the like used in calculation of the alternating current value from the A/D converted value, on the basis of the set values of the first connection-changing switch 500 and the second connection-changing switch 600, that is to say, the number of pairs in which the detection coils 120a and 120b are connected in series.

As explained above, with the current measurement device 11 according to the second embodiment of the present disclosure, the first connection-changing switch 500 of the first terminal block 101 performs a connection change so that two pairs of detection coils 120a and 120b are connected, by connecting the two detection coils 120a on the left side of the conductor 110 in series and in the same polarity, connecting the two detection coils 120b on the right side of the conductor 110 in series and in the same polarity, and connecting the detection coil 120a of the second pair on the left side and the detection coil 120b of the second pair on the right side in series and in opposite polarity (the second connection-changing switch 600 similarly accomplishes the connection change). Through this, the influence of the external magnetic field is offset, and even when a small alternating current is flowing in each of the L1-phase electric line 20 and the L2-phase electric line 30 that are connected to the first terminal block 101 and the second terminal block 201, respectively, an inductive voltage signal proportional to the magnitude of the alternating current can be acquired with high accuracy.

In addition, by switching the first connection-changing switch 500 and the second connection-changing switch 600, it is possible to regulate the output level of the measured current signal. Through this, regardless of whether the current flowing in the L1-phase electric line 20 is large or small, it is possible to keep the input range of the measured current signal that is input into the current calculator 301 constant.

As a result, it is possible to regulate the resolution in the A/D conversion by the current calculator 301, so it is possible to realize highly accurate measurement of currents ranging from large currents to small currents.

Figure 9:
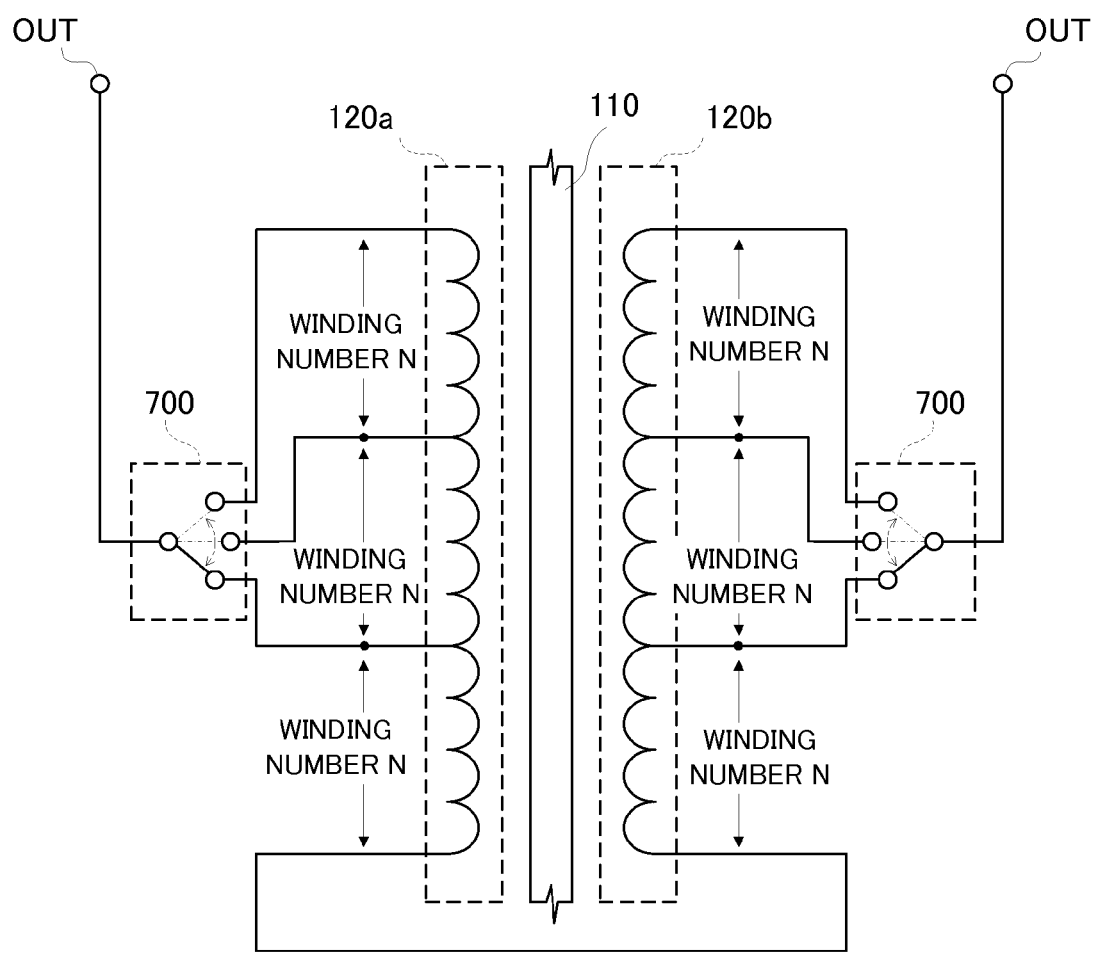
FIG. 9 is a drawing showing an example of changing the number of windings of a detection coil according to a variation.

In the second embodiment, the number of connection pairs of detection coils 120a and 120b can be changed by adding or subtracting the number of pairs of detection coils 120a and 120b by means of the first connection-changing switch 500 and the second connection-changing switch 600, but this is intended to be illustrative and not limiting. As shown in FIG. 9, a winding changer 700 may change the number of windings for both of the detection coils 120a and 120b to the same number. For example, when the winding changer 700 changes the number of windings N to double, the number of windings N of the detection coil 120a is doubled to "2N", and the number of windings N of the detection coil 120b is correspondingly doubled to "2N".

The linkage flux of the detection coils 120a and 120b changes in proportion to the number of windings of the coils. Consequently, by changing the number of windings of the detection coils 120a and 120b through control from the current calculator 301, it is possible to regulate the output level of the measured current signal. The current calculator 301 calculates the to-be-measured current value by processing the inductive voltage signals from the detection coils 120a and 120b on the basis of the change value of the windings changer 700. The detection coils 120a and 120b are switched so that the coil parameters thereof are the same, and the detection coils 120a and 120b are connected in series and in opposite polarity, similar to the above-described first embodiment.

Figure 10:
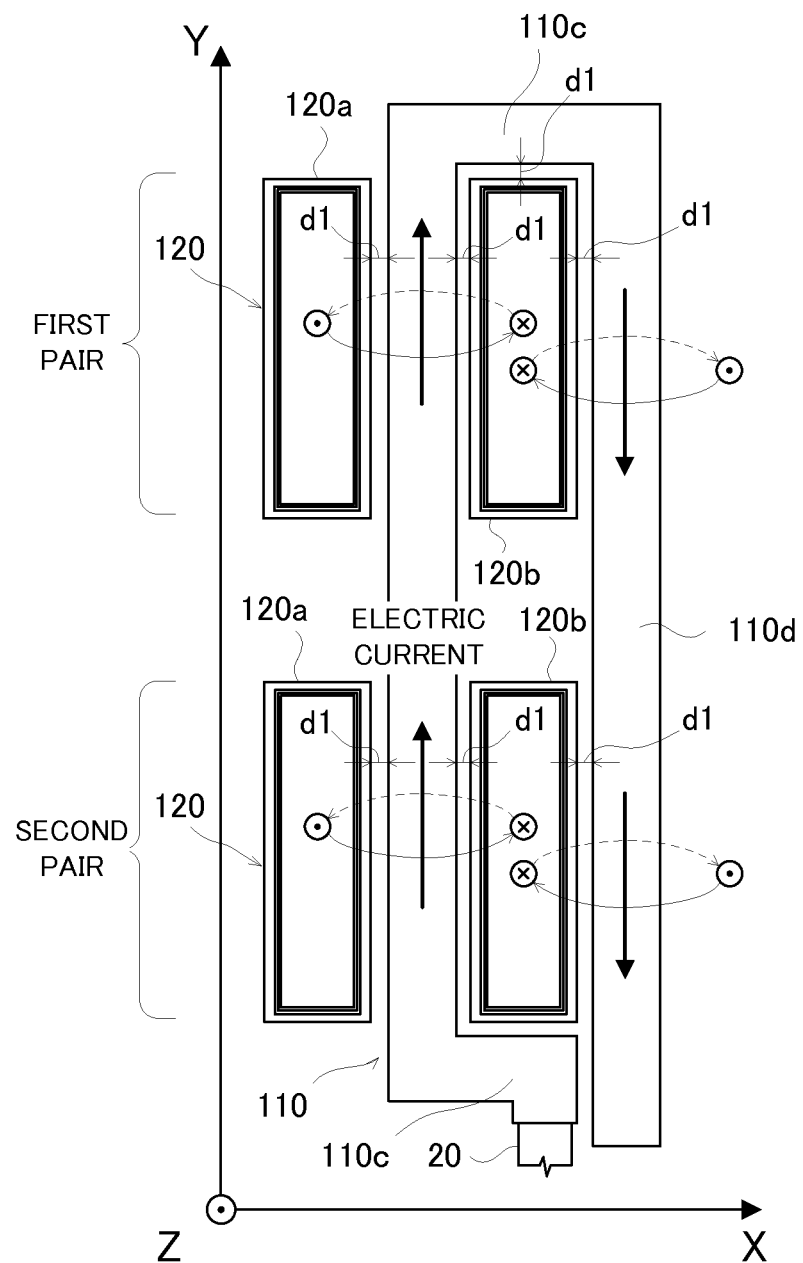
FIG. 10 is a drawing showing a configuration in which the conductor according to the second embodiment surrounds one of the detection coils.

The conductor 110 of the second embodiment is not limited to have a linear shape as shown in FIG. 7. The conductor 110 may have a shape that encompasses the two detection coils 120b, as shown in FIG. 10. In this case, the linkage flux, generated around each part 110c of the conductor 110 extending in the positive X-axis direction and the negative X-axis direction and the part 110d of the conductor 110 extending in the negative Y-axis direction, is also linked with the detection coils 120b. Consequently, the two detection coils 120b can output inductive voltage signals with high output level, as compared to the case where the conductor 110 has a linear shape as shown in FIG. 7. Also, the conductor 110 may have a shape that encompasses the two detection coils 120a.

In the second embodiment, the detection coils 120a and 120b each have a rectangular shape, but each coil may have a square shape. If each detection coil has a square shape, the S/N ratio decreases as compared to rectangular-shaped detection coils 120a and 120b with similar coil parameters, but it is possible to reduce the aspect ratio of the coil cross-section, offering the advantage that processing is easier.

The present disclosure is not limited to the above-described embodiments, and various modifications may be made without departing from the intent of the present disclosure.

Figure 11:
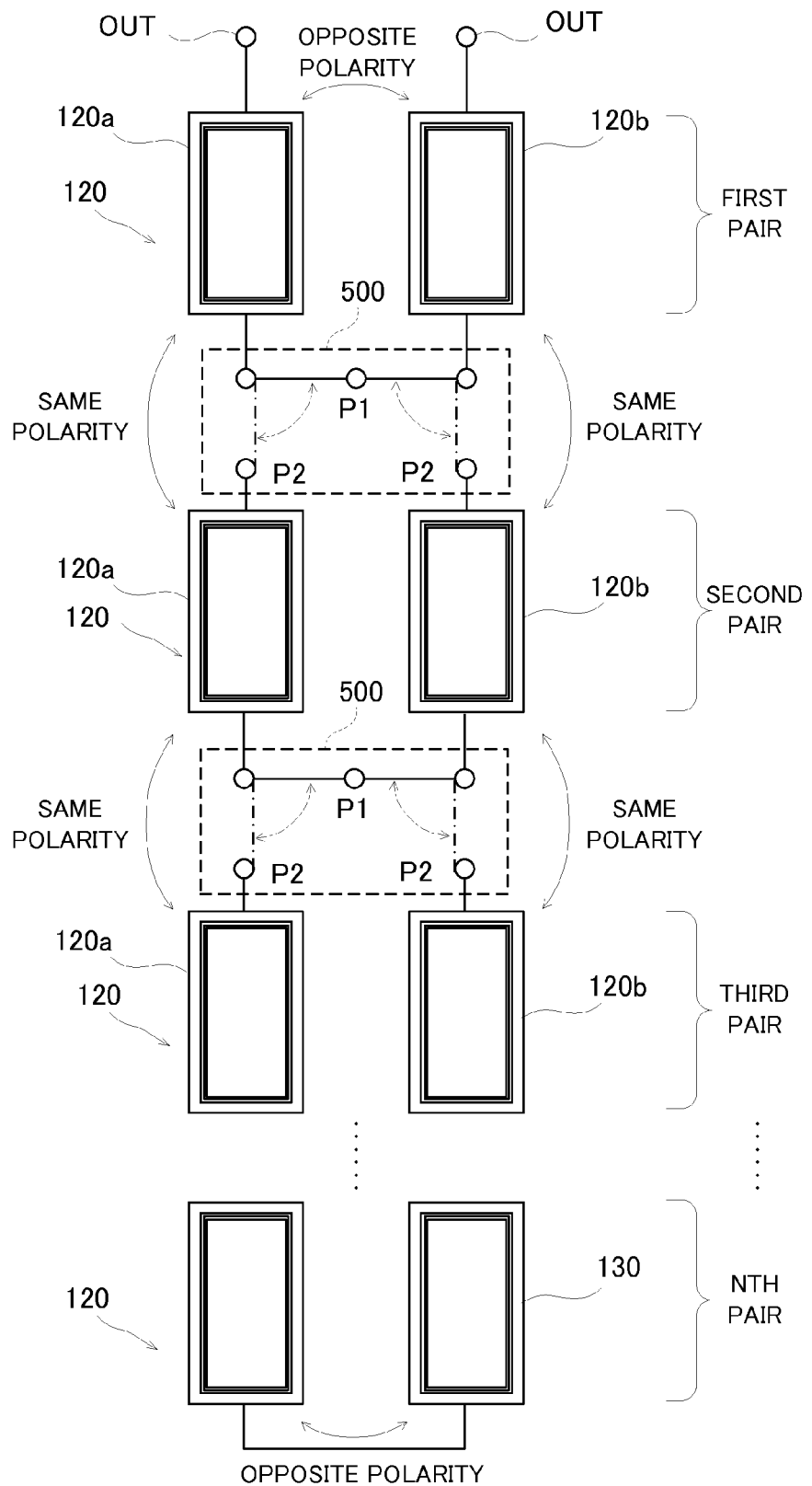
FIG. 11 is a connection diagram for when there are n pairs of detection coils in the second embodiment.

Two pairs of detection coils 120a and 120b are used in the above-described second embodiment, but n pairs may be used, where n is 3 or more. As shown in FIG. 11, a configuration may be employed in which: on the first terminal block 101 (the second terminal block 201 as well), n pairs of detection coils 120a and 120b are disposed (here, n is a natural number that is 3 or more) along the conductor 110; and a first connection-changing switch 500 and a second connection-changing switch 600 are provided to perform connection changing so that m pairs of detection coils are connected (where m is a natural number and 3≤m≤n) by connecting m detection coils 120a on one side (for example, the left side) of the conductor 110 to one another in series and in the same polarity, connecting m detection coils 120b on the other side (for example, the right side) of the conductor 110 to one another in series and in the same polarity, and connecting the $m^{th}$ detection coil 120a on the one side and the $m^{th}$ detection coil 120b on the other side to each other in series and in opposite polarity.

Thus, as the number of connection pairs of detection coils 120a and 120b is increased to m, it is possible to increase, while offsetting the influence of the external magnetic field, the output of the inductive voltage signal caused by the magnetic field generated by the conductor 110 by a factor of the number of connection pairs (here, m times), as compared to the first embodiment. Accordingly, even when the current flowing in the L1-phase electric line 20 is small, it is possible to obtain an inductive voltage directly proportional to the magnitude of the current with high accuracy.

In the above-described embodiments, the conductor 110 is fixed to the placement surface F of the first terminal block 100 by screws, but this is intended to be illustrative and not limiting. The conductor 110 may use various fixing configurations, such as being locked by a locking hook and/or the like, press fitted, adhered and/or the like. Moreover, in the above-described embodiments, the conductor 110 is a conductive plate, but this is intended to be illustrative and not limiting. The conductor 110 may be conductive wiring, conductive line, conductive plate and/or the like.

In the above-described embodiments, the power source circuit 400 generates power source voltage by rectifying and smoothing a portion of power source voltage from the L1-phase electric line 20, but this is intended to be illustrative and not limiting. The power source circuit 400 may generate power source voltage by rectifying and smoothing a portion of the power source voltage from the L2-phase electric line 30 connected to the second terminal block 200.

Furthermore, in the above-described embodiments, the current calculators 300 and 301 are described as calculators of the present disclosure by way of example, but any configuration other than that of the current calculators 300 and 301 may be employed as long as the current value is measured on the basis of the inductive current signals from the output terminals OUT.

In addition, in the above-described second embodiment, the first terminal block 101 comprises the first connection-changing switch 500 and the second terminal block 201 comprises the second connection-changing switch 600, but this is intended to be illustrative and not limiting. The current calculator 301 may comprise the first connection-changing switch 500 and the second connection-changing switch 600 to switch connections of n pairs of detection coils 120a and 120b.

In the above-described second embodiment, the first connection-changing switch 500 and the second connection-changing switch 600 are hardware switches controlled on the basis of control signals from the current calculator 301, but this is intended to be illustrative and not limiting. These connection-changing switches may be software switches, or may be manual switches operable by a worker who installs the current measurement device 11.

Furthermore, the current calculator 301 changes the set values of the first connection-changing switch 500 and the second connection-changing switch 600, that is to say, the number of the pairs of detection coils 120a and 120b connected in series, on the basis of the calculated alternating current value, but this is intended to be illustrative and not limiting. For example, the number of pairs of detection coils 120a and 120b connected in series may be manually changeable through manual switch performed a worker, and the number of pairs may be readable by the current calculator 301, so that the current calculator 301 can calculate the alternating current value in accordance with the number of pairs.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2013-102889, filed on May 15, 2013, the entire disclosure of which is incorporated by reference herein.

INDUSTRIAL APPLICABILITY

The present disclosure is suitably applied to a current measurement device and/or the like for measuring power consumed by a plant, a household and/or the like.

The invention claimed is:

1. A current measurement device comprising: a conductor in which a to-be-measured current flows; a base including a placement surface on which the conductor is disposed; a pair of detection coils having the same configuration, connected in series and in opposite polarity with respect to each other, and disposed on the placement surface of the base such that the conductor is positioned between the pair of detection coils, and each detection coil of the pair of detection coils is spaced from the conductor by an insulating distance; and a calculator configured to calculate a value of the to-be-measured current based on an inductive voltage signal from the pair of detection coils, wherein the conductor has a height greater than a width of the conductor, the height being perpendicular to the placement surface, the width being in a direction orthogonal to a direction of conduction of the conductor, and each coil of the pair of detection coils has a winding height that is perpendicular to the placement surface.

2. The current measurement device according to claim 1, wherein:
   on the base, n pairs of the detection coils are disposed along the conductor, wherein n is a natural number of 2 or more;

a connection-changing switch is provided, the connection-changing switch configured to perform connection change so that m pairs of the detection coils of the n pairs of the detection coils (where m is a natural number such that 2≤m≤n) are connected to one another, by connecting m detection coils on one side of the conductor in series and in the same polarity, connecting m detection coils on the other side of the conductor in series and in the same polarity, and connecting an $m^{th}$ detection coil on the one side to an $m^{th}$ detection coil on the other side in series and in opposite polarity with respect to each other; and the calculator is configured to set, according to the calculated value of the to-be-measured current, a value for the connection change performed by the connection-changing switch, and calculate the to-be-measured current by arithmetically processing the inductive voltage signal from the m pairs of the detection coils based on the set value of the connection-changing switch.

3. The current measurement device according to claim 1, further comprising a windings changer configured to change the number of windings of the pair of detection coils, wherein the calculator is configured to calculate the value of the to-be-measured current by arithmetically processing the inductive voltage signal from the pair of detection coils based on a change value of the windings changer.

4. The current measurement device according to claim 1, wherein each detection coil of the pair of detection coils has a rectangular cross-section, the rectangular cross-section having a long side that is parallel to the direction of conduction of the conductor.

5. The current measurement device according to claim 1, wherein the conductor has a shape surrounding an outer circumference of one detection coil of the pair of detection coils.

6. The current measurement device according to claim 5, wherein the one detection coil has a circular cross-section.

7. The current measurement device according to claim 1, wherein the base is a terminal block for connecting a primary electric line and one end of the conductor, and for connecting a secondary electric line and the other end of the conductor.

8. A current calculation method for calculating a value of a to-be-measured current flowing in a conductor, the current calculation method comprising: disposing the conductor on a placement surface of a base; disposing a pair of detection coils having the same configuration on the placement surface of the base such that the conductor is between the pair of detection coils and such that each detection coil is spaced from the conductor by an insulating distance, and connecting the pair of detection coils in series and in opposite polarity with respect to each other; and calculating the value of the to-be-measured current based on an inductive voltage signal from the pair of detection coils, wherein the conductor has a height greater than a width of the conductor, the height being perpendicular to the placement surface, the width being in a direction orthogonal to a direction of conduction of the conductor, and each coil of the pair of detection coils has a winding height that is perpendicular to the placement surface.

* * * * *